United States Patent [19]

Sun et al.

[11] Patent Number: 5,668,054
[45] Date of Patent: Sep. 16, 1997

[54] PROCESS FOR FABRICATING TANTALUM NITRIDE DIFFUSION BARRIER FOR COPPER MATALLIZATION

[75] Inventors: Shi-Chung Sun; Hien-Tien Chiu, both of Taipei; Ming-Hsing Tsai, Chiayi, all of Taiwan

[73] Assignee: United Microelectronics Corporation, Hsinchu, Taiwan

[21] Appl. No.: 584,749

[22] Filed: Jan. 11, 1996

[51] Int. Cl.$^6$ .................................................. H01L 21/28
[52] U.S. Cl. ........................ 438/653; 438/687; 438/681
[58] Field of Search .............................. 437/190, 192, 437/246, 198; 427/590

[56] References Cited

PUBLICATIONS

"Properties and Microelectronic applications of thin films of refractory metal nitrides", M. Witmer, J. Vac. Sci. Technol., A 3, 1797 (1985), (7pgs).
"Tantalum nitride as a diffusion barrier between Pd$_2$Si or CoSi$_2$ and aluminum", M.A. Farooq, et al; J. Appl. Phys., 70,1369 (1991), (6pgs).
"Interdiffusions in Cu/reactive–ion–sputtered TiN,Cu/chemical–vapor–deposited TiN, Cu/TaN and TaN/Cu/TaN thin–film structures: Low temperature diffusion analyses", J.O. Olowolafe, et al, J. Appl. Phys. 72, 4099, (1992), (5pgs).
"Chemical Vapor Deposition of Vanadium, Niobium, and Tantalum Nitride Thin Films", R. Fix, et al; Chem. Mater. 5, 614, (1993), (6pgs).
Tsai et al, "Metolorganic chemical vapor deposition of tantalum nitride by terbutylimidotris(diethylamido)tantalum for advanced metallization", Appl. Phys. Lett., vol. 67, No. 8, Aug. 1995, pp. 1128–1130.
Chiu et al, "Effect of hydrogen on deposition of tantalum nitride thin films from ethylimidotantalum complex", Jour. Mot. Sci. Lett. vol. 11, 1992, pp. 570–572.

Tsai et al, "Metal–organic chemical vapor deposition of tantalum nitride barrier layers for ULSI applications", Thin Solid Films, vol. 270, Dec. 1995, pp. 531–536.

Sun et al., "Performance of MOCVD Tantalum Nitride Diffusion Barrier for Copper Metallization", 1995 Symposium on VLSI technology Digest of Technical Papers, Kyoto, Japan Jun. 6–8, 1995, pp. 29–30.

Primary Examiner—John Niebling
Assistant Examiner—Thomas G. Bilodeau
Attorney, Agent, or Firm—Ladas & Parry

[57] ABSTRACT

A process for fabricating a tantalum nitride diffusion barrier for the advanced copper metallization of semiconductor devices is disclosed. The process comprises the steps of first preparing a semiconductor device fabricated over the surface of a silicon substrate having a component with a fabricated contact opening. Before the formation of the copper contact by deposition, the process performs a tantalum nitride low-pressure chemical-vapor-deposition procedure that deposits a layer of tantalum nitride thin film over the surface of the device substrate. After the copper deposition, a photoresist layer is subsequently fabricated for patterning the deposited copper contact and tantalum nitride layers, whereby the deposited thin film of tantalum nitride is patterned to form the thin film as the metallization diffusion barrier for the semiconductor device. The tantalum nitride low-pressure chemical-vapor-deposition procedure includes depositing a layer of tantalum nitride utilizing a metal-organic precursor terbutylimido-tris-diethylamido tantalum (TBTDET) in a cold-wall low pressure reactor with a base pressure of about 10$^{-5}$ torr. The source of the metal-organic precursor is vaporized at a temperature of about 40° to 50° C. The typical deposition pressure is about 20 mtorr. Tantalum nitride layer of low carbon content and low resistivity may thus be formed in the disclosed chemical-vapor-deposition procedure having effective capability against copper diffusion.

8 Claims, 6 Drawing Sheets

PROCESS FOR FABRICATING TANTALUM NITRIDE DIFFUSION BARRIER FOR COPPER MATALLIZATION

BACKGROUND OF THE INVENTION

1. Field of the Invention

The present invention relates in general to a tantalum nitride barrier for copper metallization in semiconductor components and the process for its fabrication. In particular, the present invention relates to a tantalum nitride barrier having superior diffusion blocking and electrical conducting characteristics that is fabricated in a procedure based on metal-organic chemical-vapor-deposition (MOCVD) for copper metallization in semiconductor components and its process of fabrication.

2. Technical Background

Aluminum used as the material for metallization in the fabrication of semiconductor devices has its inherent limitations. As the trend of miniaturization and functional improvement of semiconductor devices continues, metals having better electrical conducting characteristics than aluminum have to be used for metallization.

Refractory metal nitrides such as TiN and TaN have been proposed and studied to establish thermally stable and adhesive metallization schemes with low resistivity. For example, M. Witmer in an article in J. Vac. Sci. Technol. A. 3, 1797 (1985), and M. A. Farooq et at. in their article in J. Appl. Phys., 70, 1369 (1991), proposed depositing nitrides of Ti and/or Ta for such purposes. However, these metal nitride materials have been deposited via reactive sputtering of Ti and Ta targets in an Ar-$N_2$ atmosphere where the step coverage degrades rapidly as the aspect ratio of the features becomes greater than one.

Accordingly, there has been a growing interest in developing CVD processes for deposition of refractory metal nitride thin films. For example, J. O. Olowolafe et al. reported in their article in J. Appl. Phys., 72, 4099 (1992) the results of an investigation of interdiffusion in Cu/CVD TiN thin-film structures. The results, however, showed that the low-pressure CVD TiN was stable up to 450° C. for 30 minutes only, after which Cu started to diffuse through the TiN layer that served as the diffusion barrier and penetrate into the silicon substrate.

There was another attempt by R. Fix et at. in their article in Chem. Mater., 5, 614 (1993) to grow CVD TaN by using Ta(NMe$_2$)$_5$ and ammonia chemistry, resulting in a tetragonal phase Ta$_3$N$_5$ film. This tetragonal phase Ta$_3$N$_5$ is known as a dielectric material with very high resistivity (greater than $10^6$ μΩ-cm). Such high resistivity hampers its usefulness as diffusion barrier for advanced metallization utilizing a metal such as Cu.

SUMMARY OF THE INVENTION

It is therefore the primary object of the present invention to provide a tantalum nitride diffusion barrier for the copper metallization of semiconductor devices and its process of fabrication that allow the fabricated barrier to withstand Cu diffusion at higher sintering temperatures with high thermal stability.

It is another object of the present invention to provide a tantalum nitride diffusion barrier for the copper metallization of semiconductor devices and its process of fabrication that display low resistivity characteristics in the film of diffusion barrier while being able to withstand Cu diffusion at high temperature for prolonged periods of time.

It is still another object of the present invention to provide a tantalum nitride diffusion barrier for the copper metallization of semiconductor devices and its process of fabrication that display low leakage current characteristics in the film of diffusion barrier while being able to withstand Cu diffusion at high temperature for a prolonged period.

It is yet another object of the present invention to provide a tantalum nitride diffusion barrier for the copper metallization of semiconductor devices and its process of fabrication that features good step coverage.

To achieve the above-identified objects, the present invention provides a process for fabricating a tantalum nitride diffusion barrier for the advanced copper metallization of semiconductor devices. The process comprises the steps of first preparing a semiconductor device fabricated on the surface of a silicon substrate having a component with a fabricated contact opening. Before the formation of the copper contact by deposition, the process performs a tantalum nitride low-pressure chemical-vapor-deposition procedure that deposits a layer of tantalum nitride thin film over the surface of the device substrate. After the copper deposition, a photoresist layer is subsequently fabricated for patterning the deposited copper contact and tantalum nitride layers, whereby the deposited thin film of tantalum nitride is patterned to form the thin film as the metallization diffusion barrier for the semiconductor device. The tantalum nitride low-pressure chemical-vapor-deposition procedure includes depositing a layer of tantalum nitride utilizing a metal-organic precursor terbutylimido-tris-diethylamido tantalum (TBTDET) in a cold-wall low pressure reactor with a base pressure of about $10^{-5}$ torr. The source of the metal-organic precursor is vaporized at a temperature of about 40° to 50° C. The typical deposition pressure is about 20 mtorr.

DESCRIPTION OF THE DRAWINGS

Other objects and features of the present invention are described with reference to the preferred embodiments exemplified below with the accompanying drawing in which FIGS. 1a–1d schematically show the cross-sectional views of a semiconductor device being metallized in accordance with a preferred embodiment of the present invention as depicted from the selected process steps thereof.

DETAILED DESCRIPTION OF THE PREFERRED EMBODIMENT

The present invention is aimed at developing a chemical vapor deposited metal nitride film which can withstand Cu diffusion at a higher sintering temperature while maintaining high temperature stability. In a preferred embodiment of the present invention, low-resistivity and low carbon concentration TaN thin film is deposited by a low-pressure CVD method using a new metal-organic precursor terbutylimido-tris-diethylamido tantalum (TBTDET).

FIGS. 1a–1d of the accompanied drawing of the present invention depicts the cross-sectional views of a semiconductor device being metallized in accordance with a preferred embodiment of the present invention as depicted from the selected process steps thereof. The depicted process steps schematically exemplify the simple process of the fabrication of the effective diffusion barrier for advanced metallization in device fabrication.

Step 1

Prepare a semiconductor device fabricated over the surface of a silicon substrate having a component with a fabricated contact opening.

Figure 1A:
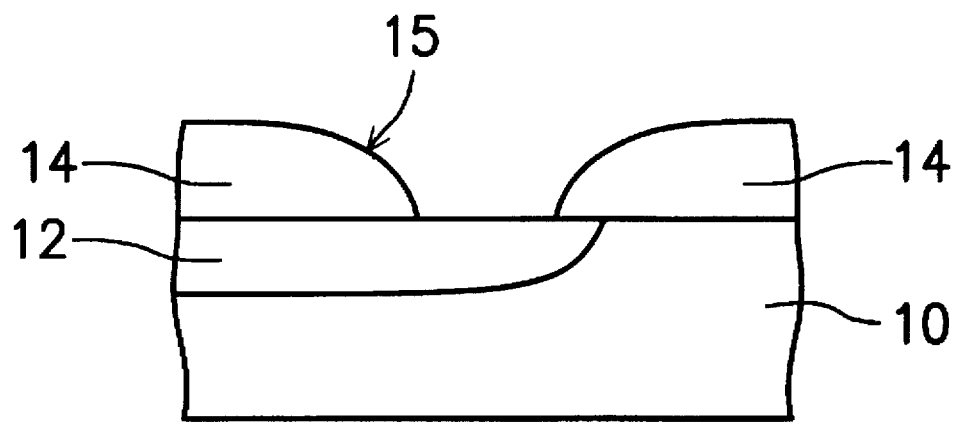

For example, as is seen in FIG. 1a, for a semiconductor device having a component such as a transistor is fabricated on the substrate 10, the drain 12 thereof is to be metallized. A contact opening 15 is formed in the insulator layer 14 covering the surface of the device substrate.

Step 2

Perform a metal-organic low-pressure chemical-vapor-deposition procedure depositing a layer of metal nitride over the surface of the device substrate.

Figure 1B:
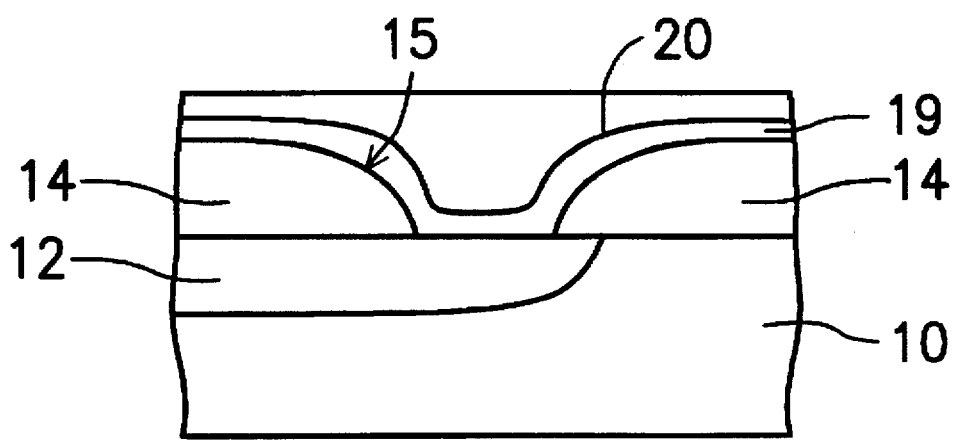

As is seen in FIG 1b, a thin film 19 of TaN is then deposited over the surface of the device substrate, covering the entire area including the contact opening 15. The MOCVD procedure may be conducted in a cold-wall low-pressure reactor with the low base pressure of about $10^{-5}$ torr. The TaN thin film 19 is deposited using the metal-organic precursor terbutylimido-tris-diethylamido tantalum (TBTDET). The source may then be vaporized at about 40° to 50° C. Typical deposition pressure was about 20 mtorr.

Step 3

Deposit a copper layer over the surface of the metal nitride.

Still referring to FIG. 1b. A layer of copper 20 that is to be subsequently formed into a pattern and utilized as the copper conductor for the fabricated device is deposited over the surface of the tantalum nitride deposited in the previous step. The formation of the copper layer 20 may be implemented in a physical vapor-deposition (PVD) or a chemical-vapor-deposition procedure, resulting in a copper layer having the required thickness.

Step 4

Fabricate a photoresist layer for patterning the deposited copper and metal nitride layers.

Figure 1C:
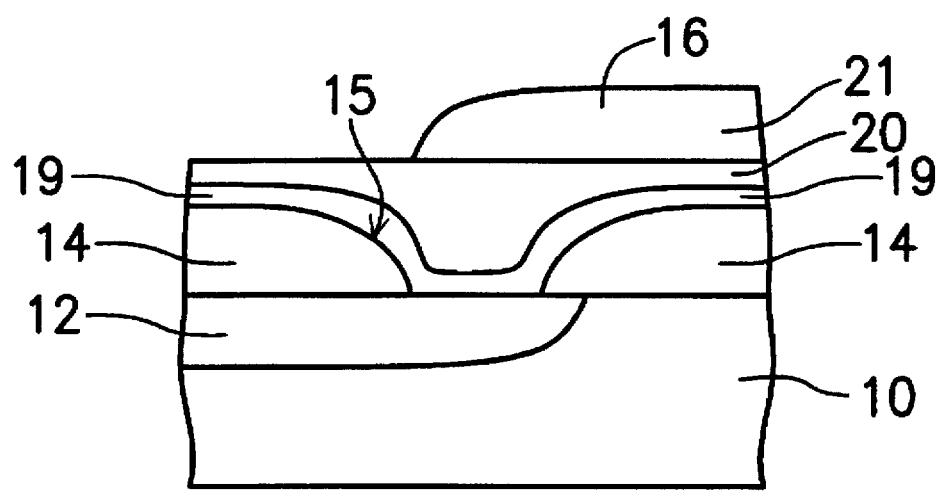

As is then seen in FIG. 1c, a photoresist layer 16 is then formed over the surface of the layer of the deposited copper layer 20 and the TaN thin film 19. This may be done in a photolithography procedure known to persons skilled in the art.

Step 5

Pattern the deposited thin film to form the layer as the metallization diffusion barrier.

Figure 1D:
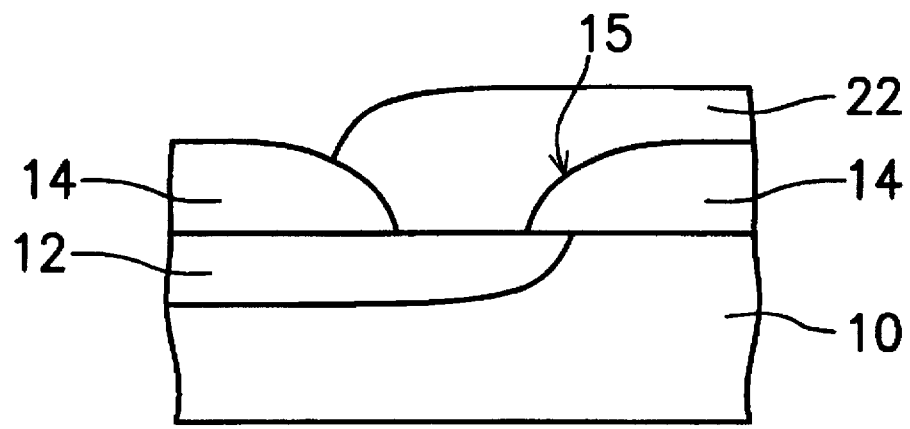

As is seen in FIG. 1d, the photoresist layer 16 is then utilized as the mask for performing a controlled etching procedure against the exposed portions of the deposited copper layer 20 and thin TaN film 19. The metallization diffusion barrier layer and the copper conductor with the predetermined pattern 22 is thereby formed as shown in the drawing.

Figure 2:
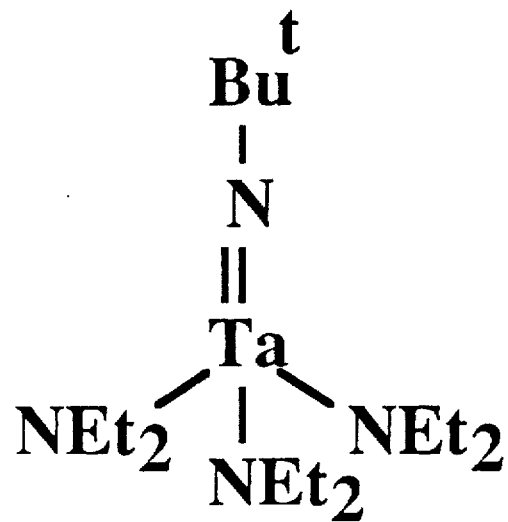
FIG. 2 schematically shows the molecular structure of the precursor TBTDET used in the fabrication process of the present invention for the diffusion barrier for advanced Cu metallization.

FIG. 2 shows the molecular structure of TBTDET Ta=NBu$^t$(NEt$_2$)$_3$. The strong Ta=N double bond has preserved the "TAN" portion of the precursor and results in a cubic phase TaN film during the pyrolysis process.

Figure 3:
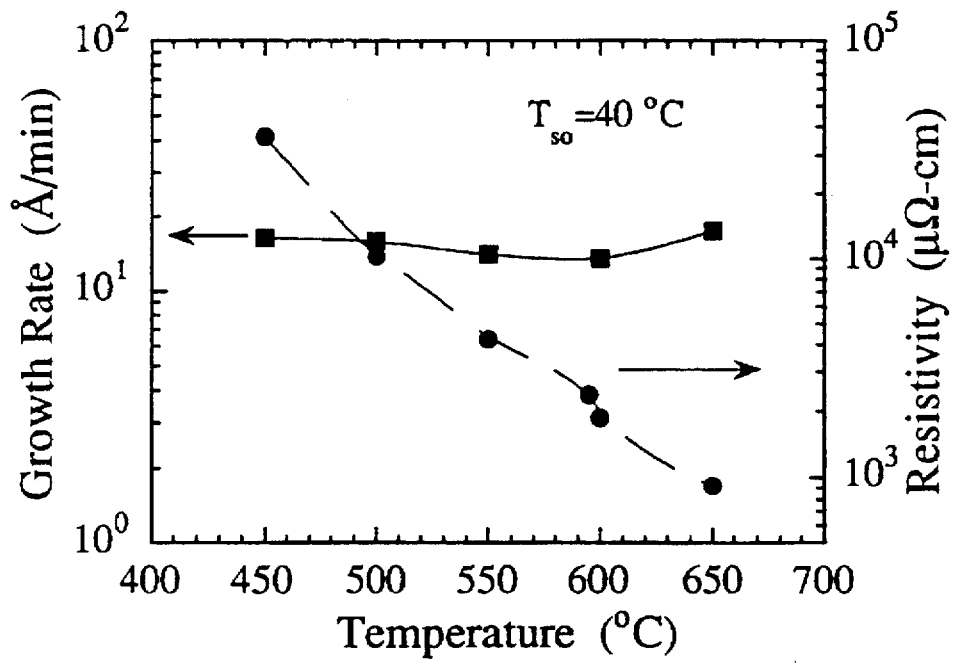
FIG. 3 shows the dependence of deposition rate and film resistivity on the wafer temperature for the diffusion barrier film of the present invention.

Several experiments were conducted to compare the various characteristics of diffusion barrier fabricated in accordance with the process of the present invention to that of the prior art. Specifically, the FIG. 3 shows the dependence of deposition rate and film resistivity on the wafer temperature for the diffusion barrier film of the present invention. The graphical relationship shows that the deposition rate is largely independent of the substrate temperature. However, higher deposition temperatures yield lower resistivities. The lowest resistivity obtained was 600 μΩ-cm at a source temperature of 45° C. and substrate temperature of 600° C.

Scanning electron microscope (SEM) micrographs of 60-nm TaN deposited in accordance with the preferred embodiment of the present invention at 450° and 600° C. were taken. The SEM micrographs show that the 450° C. film had nearly 100% step coverage and no obvious grain structure. At 600° C. the coverage was reduced to 40%, but still demonstrated an excellent continuity around the corner region of the bottom of the contact.

Figure 4A:
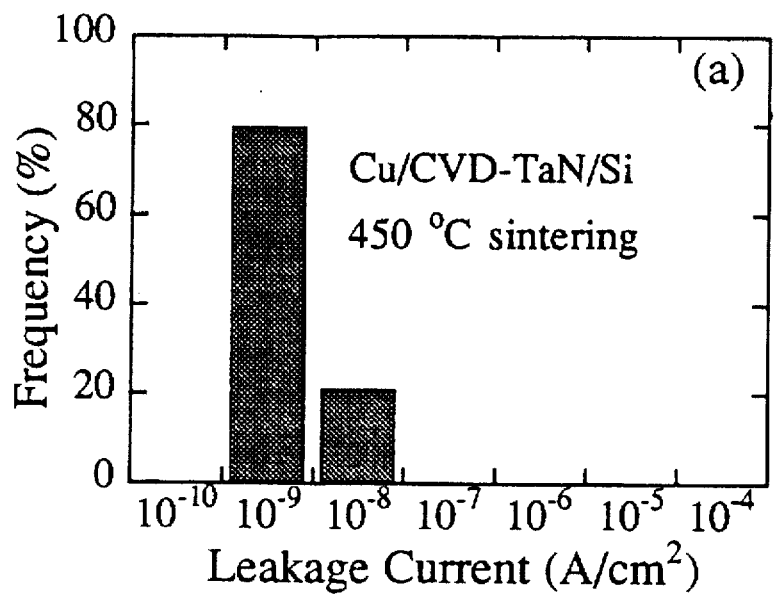
FIGS. 4a–4c show the leakage current distribution of Cu/TaN metallized junction for the present invention after sintering at 450°, 500° and 550° C. respectively.
Figure 4B:
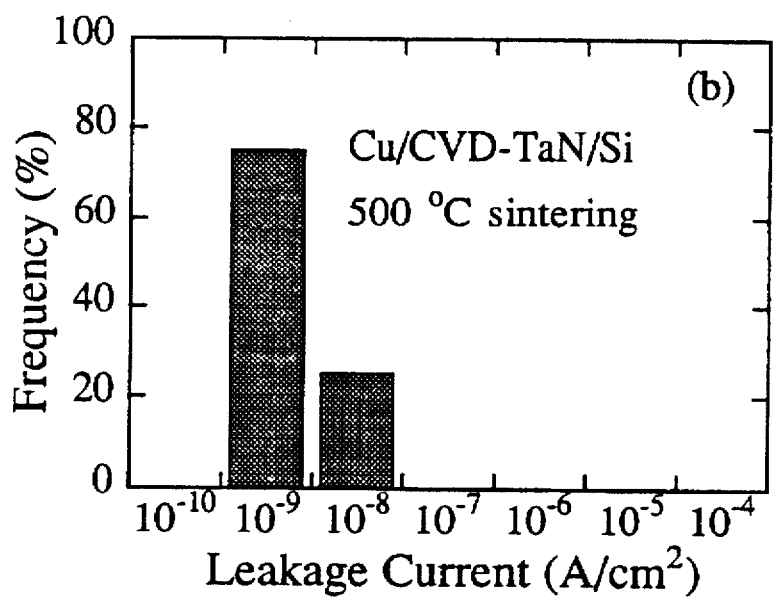
Figure 4C:
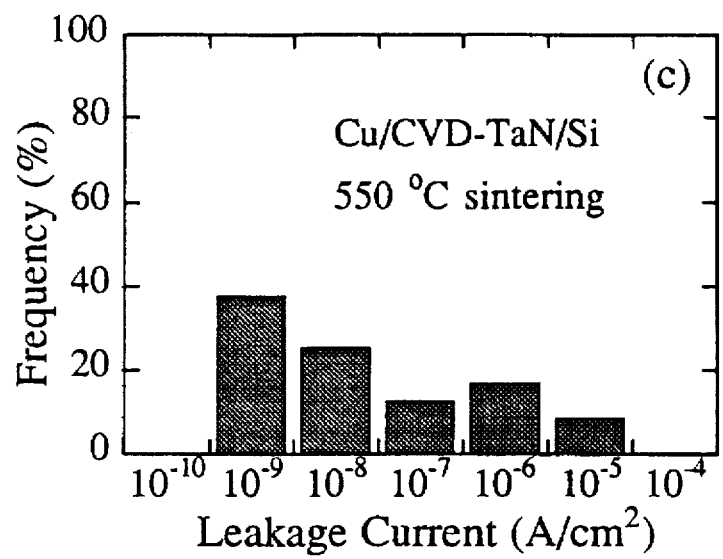
Figure 5A:
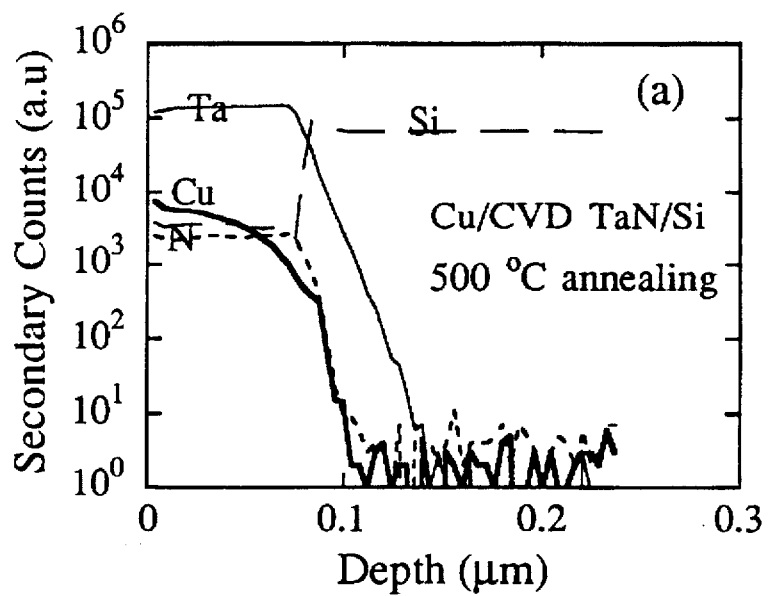
FIGS. 5a–5c show the SIMS profiles of Cu diffusion in the TaN film of the present invention sintered at 500°, 550° and 600° C. respectively.
Figure 5B:
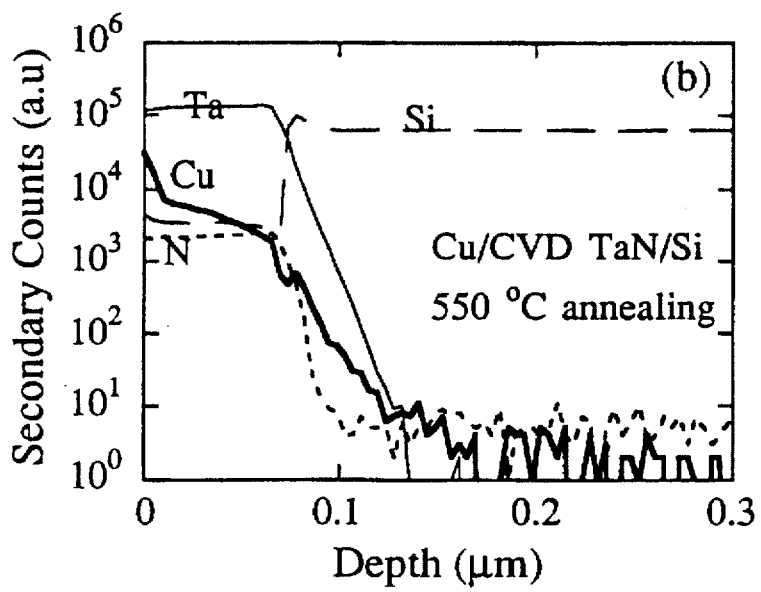
Figure 5C:
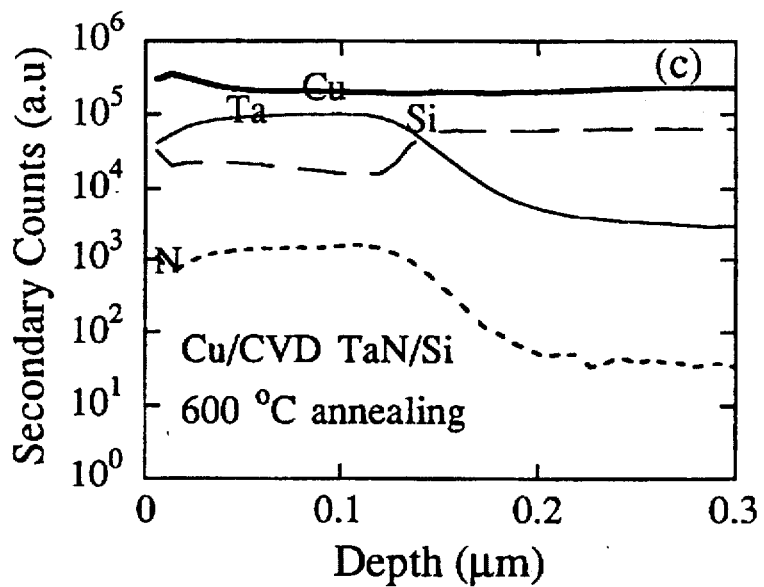

In order to find the thermal stability of the CVD TaN film of the present invention as a barrier layer against Cu diffusion, leakage current was measured as the wafers were stressed sequentially at 450°, 500° and 550° C. in vacuum for 30 minutes at each temperature. As shown in FIGS. 4a–4c, leakage current remains stable up to 500° C. For samples sintered at 500° C., Cu appears to have stayed within the TaN film as indicated in the SIMS profiles of FIGS. 5a–5c. At 550° C. Cu begins to intrude through TaN. The breakdown of TaN occurs at 600° C. It is plausible that the nitrogen impurities in TaN grain boundaries and nitrogen atoms located at interstitial sites of cubic TaN structure block the diffusion paths of Cu and Si, resulting in a higher interdiffusion temperature.

It is therefore demonstrated that MOCVD TaN of the present invention is an excellent barrier material with a good step coverage, low resistivity, low leakage current and high thermal stability. The experimental results indicate that TaN film of the present invention prevents the interdiffusion of Cu and Si up to 500° C. for 30 minutes, which is more improved than that achieved by the prior art CVD TiN diffusion barrier.

Although the described embodiment of the process of the present invention has employed a transistor as the device to fabricate the diffusion barrier, it is apparent, however, to persons skilled in the art that transistors are not the only device to require a metallization diffusion barrier. Further, the conditions of the fabrication may subject to various modification without departing from the scope of the present invention which is contained in the recited claims that follow.

We claim:

1. A process for fabricating a metal nitride diffusion barrier for the metallization of semiconductor devices comprising the steps of:

preparing a semiconductor device fabricated over the surface of a silicon substrate having a component with a fabricated contact opening;

performing a metal-organic low-pressure chemical-vapor-deposition procedure depositing a layer of metal nitride film over the surface of said silicon substrate and covering said contact opening;

depositing a copper layer over the surface of said metal nitride film;

fabricating a photoresist layer for patterning said deposited copper layer and said metal nitride film; and patterning said deposited copper layer and said metal nitride film to form said film as a metallization diffusion barrier;

wherein said metal-organic low-pressure chemical-vapor-deposition procedure includes depositing a layer of tantalum nitride utilizing a metal-organic precursor terbutylimidotris-diethylamido tantalum (TBTDET).

2. The process for fabricating a metal nitride diffusion barrier for metallization of claim 1, wherein said metal-organic low-pressure chemical-vapor-deposition procedure includes depositing the layer of tantalum nitride in a cold-wall low-pressure reactor with a low base pressure of about $10^{-5}$ torr.

3. The process for fabricating a metal nitride diffusion barrier for metallization of claim 2, wherein said metal-organic low-pressure chemical-vapor-deposition procedure includes depositing the layer of tantalum nitride in said cold-wall low-pressure reactor with the source of said metal-organic precursor vaporized at about 40° to 50° C.

4. The process for fabricating a metal nitride diffusion barrier for metallization of claim 3, wherein said metal-organic low-pressure chemical-vapor-deposition procedure depositing the layer of tantalum nitride in said cold-wall low-pressure reactor with a deposition pressure of about 20 mtorr.

5. The process for fabricating a metal nitride diffusion barrier for the metallization of claim 4, wherein said copper layer is deposited by a physical-vapor-deposition procedure.

6. The process for fabricating a metal nitride diffusion barrier for metallization of claim 4, wherein said copper layer is deposited by a chemical-vapor-deposition procedure.

7. The process for fabricating a metal nitride diffusion barrier for metallization of claim 6, wherein said metal-organic precursor has a molecular structure of Ta≡NBu$^t$ (NEt$_2$)$_3$.

8. The process for fabricating a metal nitride diffusion barrier for metallization of claim 6, wherein said metal-organic precursor has a molecular structure of Ta≡NBu$^t$ (NEt$_2$)$_3$ and said deposited tantalum nitride film is a cubic phase film.

* * * * *